United States Patent
Endo et al.

(10) Patent No.: US 7,378,229 B2
(45) Date of Patent: May 27, 2008

(54) PATTERN FORMATION METHOD

(75) Inventors: Masayuki Endo, Osaka (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 535 days.

(21) Appl. No.: 11/009,055

(22) Filed: Dec. 13, 2004

(65) Prior Publication Data

US 2005/0130067 A1    Jun. 16, 2005

(30) Foreign Application Priority Data

Dec. 16, 2003    (JP)    ............... 2003-417834

(51) Int. Cl.
    *G03F 7/00*    (2006.01)
(52) U.S. Cl. ............ 430/322; 430/324; 430/315
(58) Field of Classification Search ......... 430/324, 430/330, 322, 314, 315, 311
    See application file for complete search history.

(56) References Cited

U.S. PATENT DOCUMENTS

| 5,858,620 A | * | 1/1999 | Ishibashi et al. | ............ | 430/313 |
| 6,319,853 B1 | * | 11/2001 | Ishibashi et al. | ............ | 438/780 |
| 6,503,693 B1 | * | 1/2003 | Mohondro et al. | ......... | 430/328 |
| 2004/0028936 A1 | * | 2/2004 | Kogiso et al. | ............ | 428/606 |

FOREIGN PATENT DOCUMENTS

JP    10-073927    3/1998

OTHER PUBLICATIONS

Ishibashi, T., et al. "Advanced Micro-Lithography Process with Chemical Shrink Technology." Jpn. Journal of Applied Phys. vol. 40, 2001, pp. 419-425.

* cited by examiner

*Primary Examiner*—Mark F. Huff
*Assistant Examiner*—Caleen O Sullivan
(74) *Attorney, Agent, or Firm*—McDermott Will & Emery LLP

(57) ABSTRACT

In a pattern formation method, pattern exposure is performed by selectively irradiating, with exposing light, a resist film formed on a substrate and made of a resist including a carboxylic acid derivative. A first resist pattern is formed by developing the resist film after the pattern exposure, and subsequently, the first resist pattern is exposed to a solution including a reducing agent for reducing the carboxylic acid derivate. Thereafter, a water-soluble film including a crosslinking agent for causing crosslinking with a material of the first resist pattern is formed on the first resist pattern having been exposed to the solution. Subsequently, a crosslinking reaction is caused by annealing the water-soluble film between a portion of the water-soluble film and a portion of the first resist pattern in contact with each other on the sidewall of the first resist pattern, and then, a portion of the water-soluble film not reacted with the first resist pattern is removed. Thus, a second resist pattern made of the first resist pattern and a portion of the water-soluble film remaining on the sidewall of the first resist pattern is formed.

9 Claims, 16 Drawing Sheets

PATTERN FORMATION METHOD

CROSS-REFERENCE TO RELATED APLICATIONS

This application claims priority under 35 U.S.C. §119 on Patent Application No. 2003-417834 filed in Japan on Dec. 16, 2003, the entire contents of which are hereby incorporated by reference.

BACKGROUND OF THE INVENTION

The present invention relates to a pattern formation method for use in fabrication process or the like for semiconductor devices.

Recently, in the fabrication process for semiconductor devices, the resolution of a resist pattern obtained by lithography has been further refined in accordance with increase of the degree of integration of semiconductor devices. In particular, in a resist pattern having an opening (a hole) for forming a contact hole, the contrast is lowered when the conventional photolithography is employed, and hence, it has become difficult to obtain a desired shape.

Therefore, for forming a fine contact hole pattern through the photolithography, a method in which an opening of the contact hole pattern is shrunk by forming a water-soluble film including a crosslinking agent over a resist pattern previously formed and causing a crosslinking reaction between the resist pattern and the water-soluble film with heat used as a catalyst by using an acid remaining in an unexposed portion of the resist pattern has been proposed (see, for example, T. Ishibashi et al., "Advanced Micro-Lithography Process with Chemical Shrink Technology", Jpn. J. Appl. Phys., Vol. 40, 2001, pp. 419-425).

Now, a pattern formation method employing the conventional chemical shrink method will be described with reference to FIGS. 15A through 15D and 16A through 16C.

First, a positive chemically amplified resist material having the following composition is prepared:

Base polymer: poly(2-methyl-2-adamantyl acrylate-methacrylic acid) . . . 2 g

Acid generator: triphenylsulfonium nonaflate . . . 0.06 g

Solvent: propylene glycol monomethyl ether acetate . . . 20 g

Next, as shown in FIG. 15A, the chemically amplified resist material is applied on a substrate 1, so as to form a resist film 2 with a thickness of 0.4 µm.

Then, as shown in FIG. 15B, the resist film 2 is subjected to pattern exposure by irradiating with exposing light 3 through a mask 4 by using an ArF excimer laser stepper having numerical aperture of 0.60.

After the pattern exposure, as shown in FIG. 15C, the resist film 2 is subjected to post-exposure bake (PEB) at a temperature of 105° C. for 90 seconds.

Next, the resist film 2 is developed with a 2.38 wt % tetramethylammonium hydroxide aqueous solution (alkaline developer) for 60 seconds. Thus, as shown in FIG. 15D, an initial resist pattern 2a with an opening diameter of 0.20 µm made of an unexposed portion of the resist film 2 is obtained.

Subsequently, as shown in FIG. 16A, a water-soluble film 5 including a crosslinking agent having the following composition is applied over the substrate 1 including the initial resist pattern 2a by spin coating:

Base polymer: poly(vinyl alcohol) . . . 2 g

Crosslinking agent: 2,4,6-tris(methoxymethyl)amino-1,3,5-s-triazine . . . 0.2 g

Solvent: water . . . 30 g

Then, as shown in FIG. 16B, the water-soluble film 5 is annealed at a temperature of 130° C. for 60 seconds, so as to cause a crosslinking reaction between the sidewall of the opening of the initial resist pattern 2a and a portion of the water-soluble film 5 in contact with the sidewall.

Next, as shown in FIG. 16C, a portion of the water-soluble film 5 not reacted with the initial resist pattern 2a is removed. In this manner, a resist pattern 6 with an opening diameter of 0.15 µm made of the initial resist pattern 2a and a remaining portion 5a of the water-soluble film 5 obtained through the crosslinking reaction with the sidewall of the initial resist pattern 2a can be obtained. Thus, the opening diameter of the resist pattern 6 is shrunk to 0.15 µm as compared with that of the initial resist pattern 2a of 0.20 µm.

However, the resist pattern 6 obtained by the conventional pattern formation method is disadvantageously in a poor shape as shown in FIG. 16C. When the resist pattern 6 is thus in a poor shape, a pattern of a member to be etched in subsequent etching is also in a poor shape, which causes a serious problem in fabrication of semiconductor devices. Although a positive chemically amplified resist material is used for forming the resist film 2, such a pattern failure is caused also when a negative chemically amplified resist material is used.

In other words, a pattern of an etching target member obtained by using the resist pattern 6 in a poor shape is also in a poor shape, and therefore, productivity and yield in the fabrication process for semiconductor devices are disadvantageously lowered.

SUMMARY OF THE INVENTION

In consideration of the aforementioned conventional disadvantages, an object of the invention is forming a resist pattern in a good shape through the chemical shrink method.

The present inventors have made various examinations to fine the cause of the poor shape of the resist pattern 6 obtained by the conventional chemical shrink method, resulting in finding that the crosslinking reaction caused by the acid remaining in the unexposed portion (a side portion) of the initial resist pattern 2a between the resist material including the carboxylic acid derivative (that is, a carboxylic group or a carboxylic ester group) and the water-soluble film 5 is insufficient.

Furthermore, it has been found that when the carboxylic group or the carboxylic ester group included in the resist material is reduced into a hydroxyl group, a thermal crosslinking reaction can be easily caused in the presence of the acid between this hydroxyl group and the crosslinking agent included in the water-soluble film. Therefore, the hydroxyl group included in the resist material and the crosslinking agent can be sufficiently reacted with each other, resulting in forming a shrunk resist pattern in a good shape. This phenomenon will be described by using, as an example of the crosslinking agent, 2,4,6-tris(methoxymethyl)amino-1,3,5-s-triazine represented by Chemical Formula 1 below.

Chemical Formula 1:

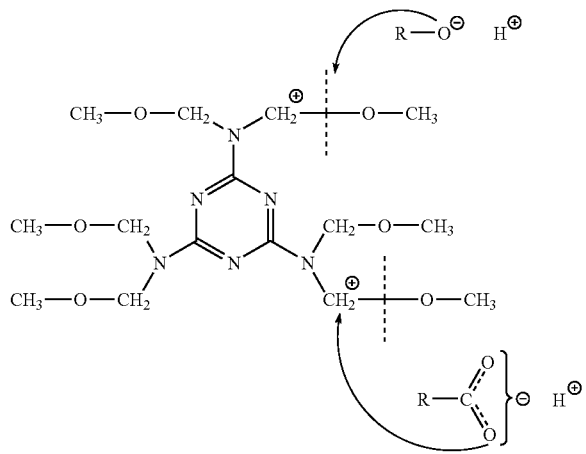

The crosslinking agent included in the water-soluble film is a compound including a three-dimensional compound having a plurality of ether bonds (R—O—R') as represented by Chemical Formula 1. When the water-soluble film including the three-dimensional compound having the plural ether bonds is formed on a resist pattern and annealed, these ether bonds are cut due to thermal energy. Specifically, the reactivity of a carboxylic group and a hydroxyl group included in the resist material is increased by the thermal energy, the ether bonds included in the water-soluble film are cut as shown in Chemical Formula 1, and R—O— or R—COO— is to coordinate in the material of the water-soluble film. At this point, since the hydroxyl group (—OH) included in a polymer (resist material) has higher reactivity than a carboxylic group (—COOH) or a carboxylic ester group (—COOR), the hydroxyl group is preferentially crosslinked with the polymer (resist material). As a result, a three-dimensional crosslinking reaction between the crosslinking agent included in the water-soluble film and the polymer (resist material) is easily proceeded. The crosslinking agent is preferably a compound having a plurality of coordination positions, and apart from 2,4,6-tris(methoxymethyl)amino-1,3,5-s-triazine, 1,3,5-N-(trihydroxymethyl) melamine, 2,4,6-tris(ethoxymethyl)amino-1,3,5-s-triazine, tetramethoxymethyl glycolurea, tetramethoxymethylurea, 1,3,5-tris(methoxymethoxy)benzene or 1,3,5-tris(isopropoxymethoxy)benzene may be used.

The present invention was devised on the basis of these findings, and according to the invention, a resist pattern having a shrunk opening diameter or space width can be formed in a good shape. Specifically, the present invention is practiced by the following methods:

The first pattern formation method of this invention includes the steps of: forming a resist film on a substrate, said resist including a carboxylic acid derivative; performing pattern exposure by selectively irradiating with exposing light; forming a first resist pattern by developing said resist film after the pattern exposure; exposing said first resist pattern to a solution including a reducing agent for reducing said carboxylic acid derivative; forming, on said first resist film having been exposed to said solution, a water-soluble film including a crosslinking agent which reacts with said first resist pattern; annealing said water-soluble film; removing a first portion of said water-soluble film; and forming a second resist pattern having said first resist pattern and a second portion of said water-soluble film, wherein said first portion of said water-soluble film is a portion which does not react with said first pattern and said second portion of said water-soluble film is a portion which reacts with said first resist pattern.

In the first pattern formation method, a carboxylic group or a carboxylic ester group of the carboxylic acid derivative included in the resist film is reduced, by the reducing agent included in the solution, into a hydroxyl group that can be easily crosslinked with the crosslinking agent. Therefore, the crosslinking reaction between the portion of the water-soluble film and the portion of the first resist pattern in contact with each other on the sidewall of the first resist pattern can be sufficiently proceeded. As a result, the second resist pattern made of the first resist pattern and the portion of the water-soluble film remaining on the sidewall of the first resist pattern and having a shrunk opening diameter or space width can be formed in a good shape. Accordingly, a target film etched by using the second resist pattern can be patterned into a good shape.

The second pattern formation method of this invention includes the steps of: forming a resist film on a substrate, said resist including a carboxylic acid derivative; performing pattern exposure by selectively irradiating with exposing light; forming a first resist pattern by developing said resist film after the pattern exposure; forming, on said first resist film, a water-soluble film including a reducing agent for reducing said carboxylic acid derivative and a crosslinking agent which reacts with said first resist pattern; annealing said water-soluble film; removing a first portion of said water-soluble film; and forming a second resist pattern having said first resist pattern and a second portion of said water-soluble film, wherein said first resist portion of said water-soluble film is a portion which does not react with said first resist pattern and said second portion of said water-soluble film is a portion which reacts with said first resist pattern.

In the second pattern formation method, a carboxylic group or a carboxylic ester group of the carboxylic acid derivative included in the resist film is reduced, by the reducing agent included in the water-soluble film, into a hydroxyl group that can be easily crosslinked with the crosslinking agent. Therefore, the crosslinking reaction between the portion of the water-soluble film and the portion of the first resist pattern in contact with each other on the sidewall of the first resist pattern can be sufficiently proceeded. As a result, the second resist pattern made of the first resist pattern and the portion of the water-soluble film remaining on the sidewall of the first resist pattern and having a shrunk opening diameter or space width can be formed in a good shape. Accordingly, a target film etched by using the second resist pattern can be patterned into a good shape.

The second pattern formation method preferably further includes, between the step of forming a first resist pattern and the step of forming a water-soluble film, a step of exposing the first resist pattern to a solution including a reducing agent for reducing the carboxylic acid derivative.

Thus, the crosslinking reaction between the water-soluble film and the first resist pattern can be more accelerated, and hence, the second resist pattern can be formed in a better shape.

In the first or second pattern formation method, the carboxylic acid derivative is preferably a carboxylic group or a carboxylic ester group.

In the first or second pattern formation method, the reducing agent is preferably hydrogen iodide (HI) or hydrogen disulfide ($H_2S$).

In the first or second pattern formation method, the reducing agent is preferably an oxide of an element having a valence lower than a standard (stoichiometric) valence.

In this case, the oxide is preferably carbon monoxide (CO) or sulfur dioxide ($SO_2$).

In the first or second pattern formation method, the reducing agent is preferably a metal that tends to emit electrons. At this point, the "metal that tends to emit electrons" means a metal capable of having a plurality of valence electron levels, such as iron (Fe) capable of being $Fe^{2+}$ and $Fe^{3+}$. Accordingly, as such a metal, zinc (Zn) or copper (Cu) may be used apart from iron.

In the first or second pattern formation method, the reducing agent preferably includes a metal ion having a valence lower than a standard valence.

In this case, the metal ion is preferably a bivalent iron ion ($Fe^{2+}$) or a bivalent tin ion ($Sn^{2+}$).

In the first pattern formation method, the concentration of the reducing agent in the solution is appropriately several wt %, which does not limit the invention.

In the second pattern formation method, the concentration of the reducing agent in the water-soluble film is appropriately several wt % of the base polymer of the water-soluble film, which does not limit the invention.

In the first or second pattern formation method, a puddle method, a dip method or a spray method may be employed in the step of exposing the first resist pattern to a solution including a reducing agent.

In the first or second pattern formation method, the resist is preferably a chemically amplified resist.

In the first or second pattern formation method, the water-soluble film preferably includes poly(vinyl alcohol), poly(vinylpyrrolidone), poly(acrylic acid), polystyrene sulfonic acid or pullulan.

In the first or second pattern formation method, the exposing light may be ArF excimer laser, KrF excimer laser, $F_2$ laser, $Kr_2$ laser, ArKr laser or $Ar_2$ laser.

In the first or second pattern formation method, the exposing light may have a wavelength of 1 nm through 30 nm.

DETAILED DESCRIPTION OF THE INVENTION

Embodiment 1

A pattern formation method according to Embodiment 1 of the invention will now be described with reference to FIGS. 1A through 1D and 2A through 2D.

First, a positive chemically amplified resist material having the following composition is prepared:

Base polymer: poly(2-methyl-2-adamantyl acrylate-methacrylic acid) . . . 2 g

Acid generator: triphenylsulfonium nonaflate . . . 0.06 g

Solvent: propylene glycol monomethyl ether acetate . . . 20 g

Figure 1A:
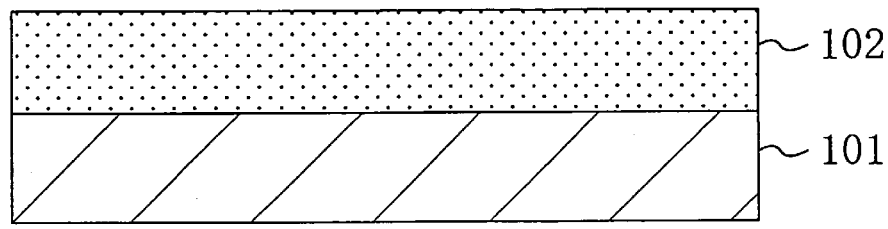
FIGS. 1A, 1B, 1C and 1D are cross-sectional views for showing procedures in a pattern formation method according to Embodiment 1 of the invention.

Next, as shown in FIG. 1A, the chemically amplified resist material is applied on a substrate 101, so as to form a resist film 102 with a thickness of 0.4 µm.

Figure 1B:
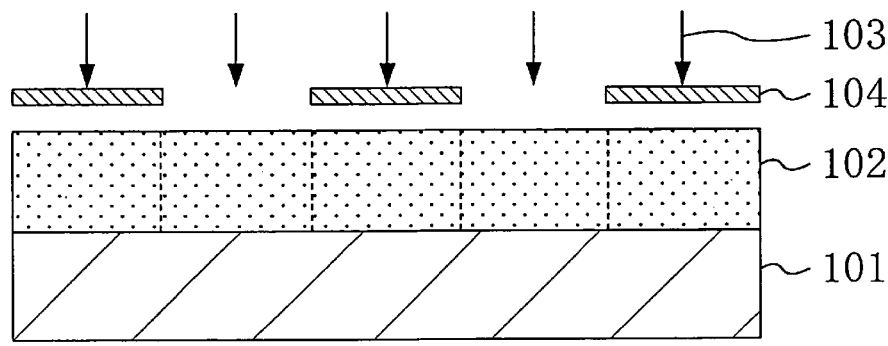

Then, as shown in FIG. 1B, the resist film 102 is subjected to pattern exposure by irradiating with exposing light 103 by using an ArF excimer laser stepper having numerical aperture (NA) of 0.60 through a mask 104 having a desired pattern.

Figure 1C:
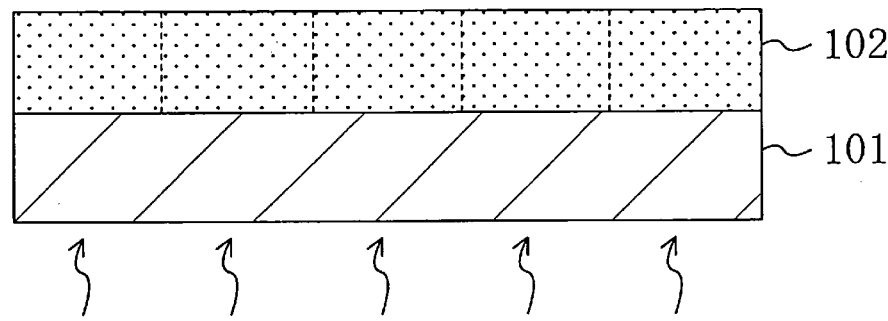

After the pattern exposure, as shown in FIG 1C, the resist film 102 is subjected to post-exposure bake (PEB) by using, for example, a hot plate at a temperature of 105° C. for 90 seconds.

Figure 1D:
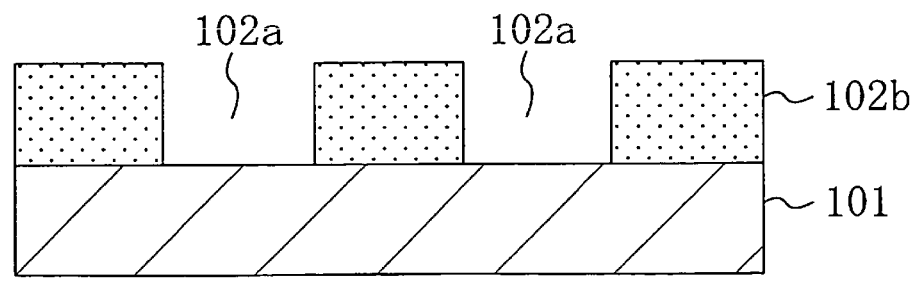

Next, the resist film 102 is developed with a 2.38 wt % tetramethylammonium hydroxide aqueous solution (alkaline developer) for 60 seconds. Thus, as shown in FIG. 1D, a first resist pattern 102b that is to be used for, for example, forming a contact hole, has an opening 102a with a diameter of 0.20 µm and is made of an unexposed portion of the resist film 102 is obtained.

Figure 2A:
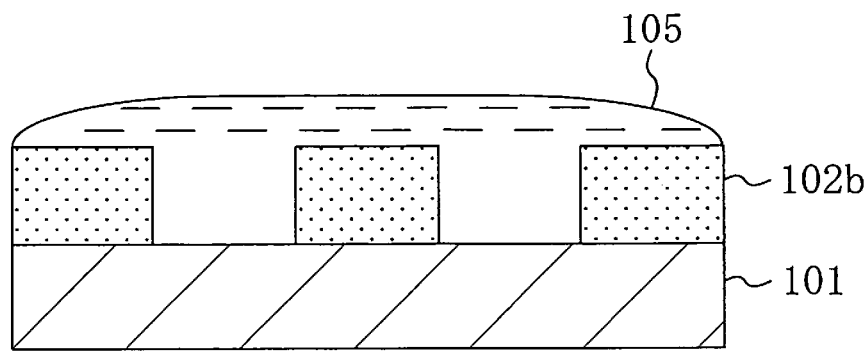
FIGS. 2A, 2B, 2C and 2D are cross-sectional views for showing other procedures in the pattern formation method according to Embodiment 1 of the invention.

Subsequently, as shown in FIG. 2A, the first resist pattern 102b having been formed on the substrate 101 is exposed to a 1.5 wt % iron dichloride (FeCl$_2$) solution 105, that is, a reducing agent for reducing carboxylic acid (methacrylic acid) included in the base polymer of the resist material, for 60 seconds by a puddle method.

Figure 2B:
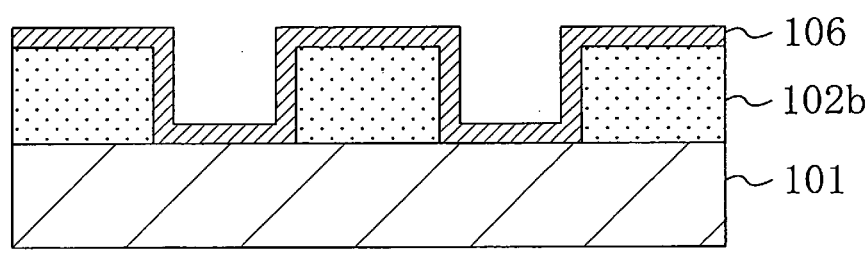

Next, as shown in FIG. 2B, a water-soluble film 106 including a crosslinking agent having a composition described below is applied over the substrate 101 including the first resist pattern 102b by spin coating. At this point, the crosslinking agent included in the water-soluble film 106 is used for causing a crosslinking reaction between the water-soluble film 106 and the base polymer included in the resist film 102.

Figure 2C:
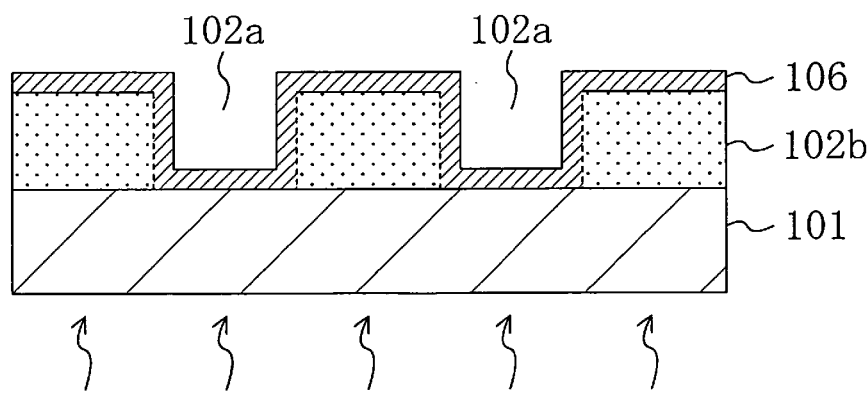

Base polymer: poly(vinyl alcohol) . . . 2 g
    Crosslinking agent: 2,4,6-tris(methoxymethyl)amino-1,3,5-s-triazine . . . 0.2 g
    Solvent: water . . . 30 g Then, as shown in FIG. 2C, the water-soluble film 106 is annealed at a temperature of 130° C. for 60 seconds, so as to cause a crosslinking reaction between a sidewall of the opening 102a of the first resist pattern 102b and a portion of the water-soluble film 106 in contact with the sidewall. At this point, the water-soluble film 106 reacts merely with the sidewall of the opening 102a of the first resist pattern 102b because the top face of the first resist pattern 102b corresponds to the unexposed portion that has not been irradiated with the exposing light 103 and hence no acid generated from the resist film 102 remains on the top face.

Figure 2D:
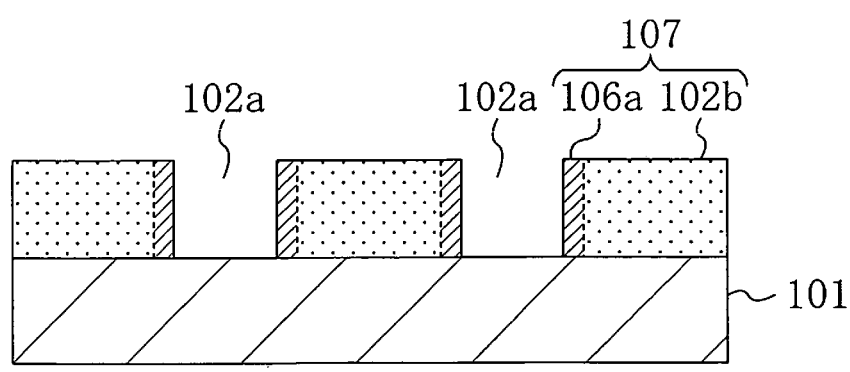

Next, a portion of the water-soluble film 106 not reacted with the first resist pattern 102b is removed by using pure water. In this manner, as shown in FIG. 2D, a second resist pattern 107 having the opening 102a with a shrunk opening diameter of 0.15 µm made of the first resist pattern 102b and a sidewall covering portion 106a of the water-soluble film 106 formed on the sidewall of the opening 102a of the first resist pattern 102b can be obtained in a good shape.

Thus, according to Embodiment 1, after forming the first resist pattern 102b, the first resist pattern 102b is exposed to the solution 105 including iron dichloride (FeCl$_2$), that is, the reducing agent for reducing the carboxylic acid (methacrylic acid) included in the resist material, so as to reduce a carboxylic group included in the resist material into a hydroxyl group. Therefore, the crosslinking reaction between the hydroxyl group resulting from the reduction and the crosslinking agent included in the water-soluble film 106 is sufficiently proceeded, and hence the second resist pattern 107 having the shrunk diameter of the opening 102a can be formed in a good shape.

Modification of Embodiment 1

A pattern formation method according to a modification of Embodiment 1 will now be described with reference to FIGS. 3A through 3D and 4A through 4D.

In the above-described Embodiment 1, the second resist pattern 107 has a thickness of 0.4 µm and the diameter of the opening 102a is 0.15 µm, and therefore, the aspect ratio (=height/opening diameter) of the opening (contact hole) 102a of the second resist pattern 107 is 0.4/0.15, namely, approximately 2.7.

Since the present invention is applicable to a contact hole with an aspect ratio of 4 or more, the application to an opening with an aspect ratio of 4 will be described as a modification of Embodiment 1.

Figure 3A:
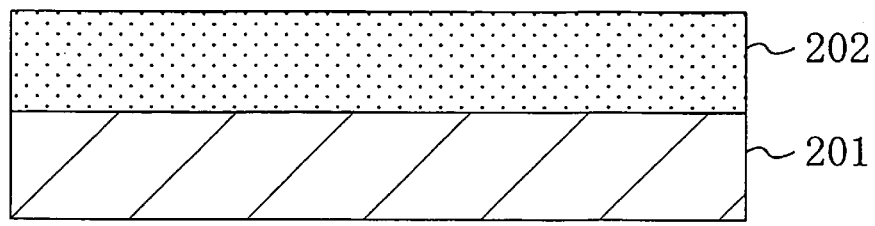
FIGS. 3A, 3B, 3C and 3D are cross-sectional views for showing procedures in a pattern formation method according to modification of Embodiment 1 of the invention.

First, a positive chemically amplified resist material having the following composition is prepared:

Base polymer: poly(2-methyl-2-adamantyl acrylate-methacrylic acid) . . . 2 g
    Acid generator: triphenylsulfonium nonaflate . . . 0.06 g
    Solvent: propylene glycol monomethyl ether acetate . . . 20 g Next, as shown in FIG. 3A, the chemically amplified resist material is applied on a substrate 201, so as to form a resist film 202 with a thickness of 0.4 µm.

Figure 3B:
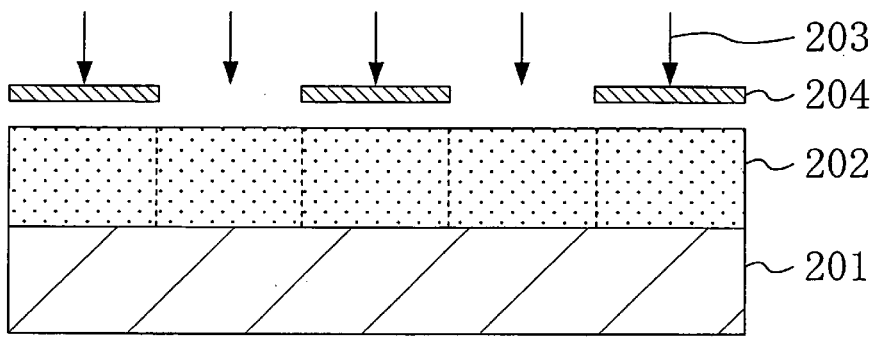

Then, as shown in FIG. 3B, the resist film 202 is subjected to pattern exposure by irradiating with exposing light 203 by using an ArF excimer laser stepper having numerical aperture (NA) of 0.68 through a mask 204 having a desired pattern.

Figure 3C:
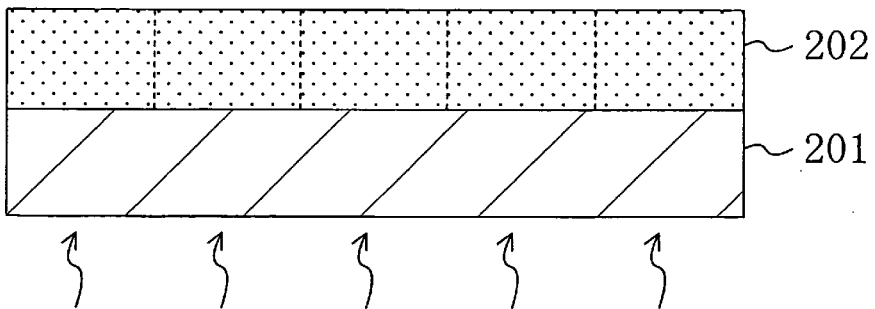

After the pattern exposure, as shown in FIG. 3C, the resist film 202 is subjected to post-exposure bake (PEB) by using, for example, a hot plate at a temperature of 105° C. for 90 seconds.

Figure 3D:
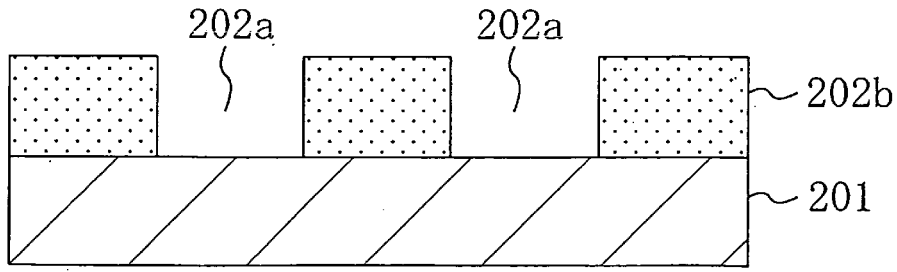

Next, the resist film 202 is developed with a 2.38 wt % tetramethylammonium hydroxide aqueous solution (alkaline developer) for 60 seconds. Thus, as shown in FIG. 3D, a first resist pattern 202b that is to be used for, for example, forming a contact hole, has an opening 202a with a diameter of 0.15 µm and is made of an unexposed portion of the resist film 202 is obtained.

Figure 4A:
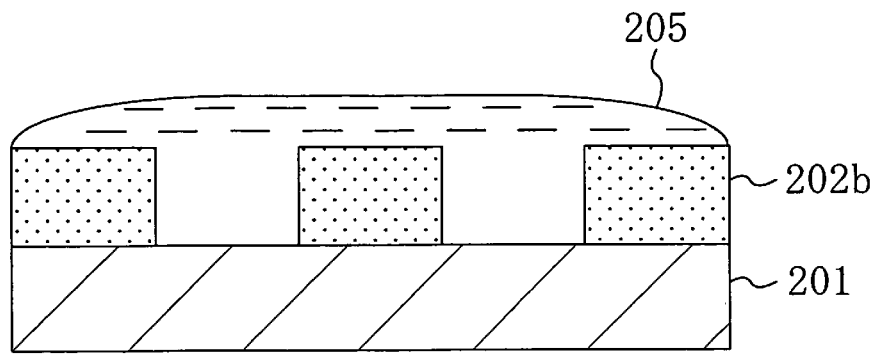
FIGS. 4A, 4B, 4C and 4D are cross-sectional views for showing other procedures in the pattern formation method according to the modification of Embodiment 1 of the invention.

Subsequently, as shown in FIG. 4A, the first resist pattern 202b having been formed on the substrate 201 is exposed to a 1.5 wt % iron dichloride (FeCl$_2$) solution 205, that is, a reducing agent for reducing carboxylic acid (methacrylic acid) included in the base polymer of the resist material, for 60 seconds by the puddle method.

Figure 4B:
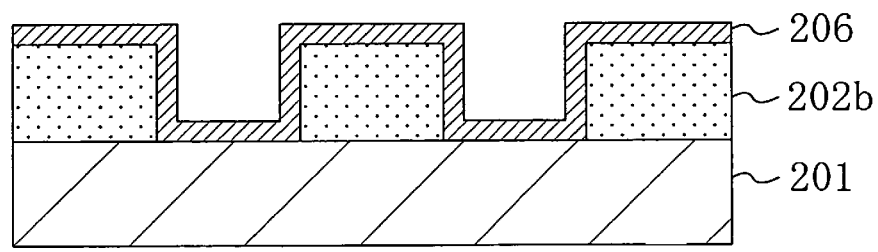

Next, as shown in FIG. 4B, a water-soluble film 206 including a crosslinking agent having a composition described below is applied over the substrate 201 including the first resist pattern 202b by the spin coating. At this point, the crosslinking agent included in the water-soluble film 206 is used for causing a crosslinking reaction between the water-soluble film 206 and the base polymer included in the resist film 202.

Figure 4C:
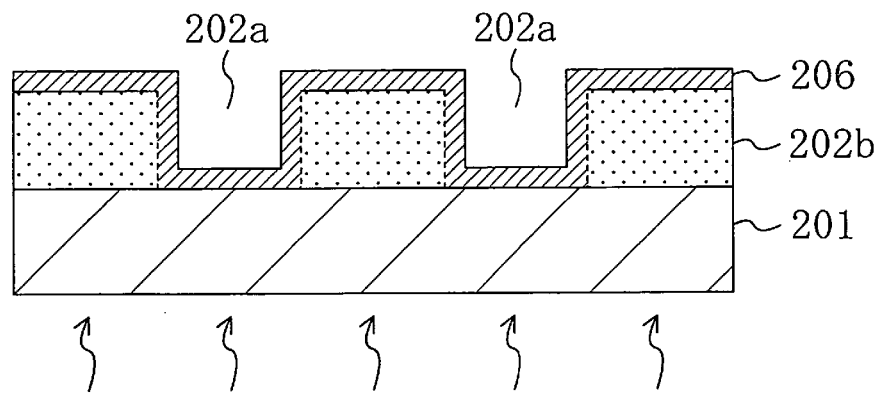

Base polymer: poly(vinyl alcohol) . . . 2 g
    Crosslinking agent: 2,4,6-tris(methoxymethyl)amino-1,3,5-triazine . . . 0.2 g
    Solvent: water . . . 30 g Then, as shown in FIG. 4C, the water-soluble film 206 is annealed at a temperature of 130° C. for 60 seconds, so as to cause a crosslinking reaction between a sidewall of the opening 202a of the first resist pattern 202b and a portion of the water-soluble film 206 in contact with the sidewall. At this point, the water-soluble film 206 reacts merely with the sidewall of the opening 202a of the first resist pattern 202b because the top face of the first resist pattern 202b corresponds to the unexposed portion that has not been irradiated with the exposing light 203 and hence no acid generated from the resist film 202 remains on the top face.

Figure 4D:
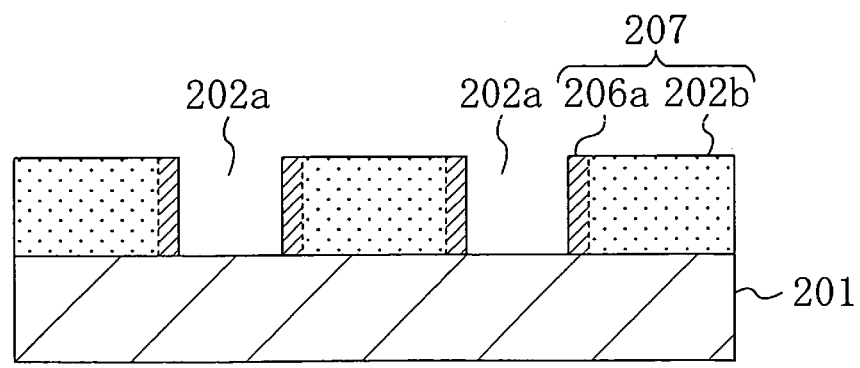

Next, a portion of the water-soluble film 206 not reacted with the first resist pattern 202b is removed by using pure water. In this manner, as shown in FIG. 4D, a second resist pattern 207 having the opening 202a with a shrunk opening diameter of 0.1 µm made of the first resist pattern 202b and a sidewall covering portion 206a of the water-soluble film 206 formed on the sidewall of the opening 202a of the first resist pattern 202b can be obtained in a good shape.

Thus, according to this modification, the thickness of the second resist pattern is 0.4 µm and the opening diameter is 0.1 µm, and hence, the aspect ratio of the opening (contact hole) 202a is 4. Even when the aspect ratio is thus comparatively high, the carboxylic acid (methacrylic acid) included in the resist film is reduced into a hydroxyl group and the crosslinking reaction between this hydroxyl group and the crosslinking agent included in the water-soluble film 206 is sufficiently proceeded, and hence, the second resist pattern 207 can be formed in a good shape.

Embodiment 2

A pattern formation method according to Embodiment 2 of the invention will now be described with reference to FIGS. 5A through 5D and 6A through 6D.

Figure 5A:
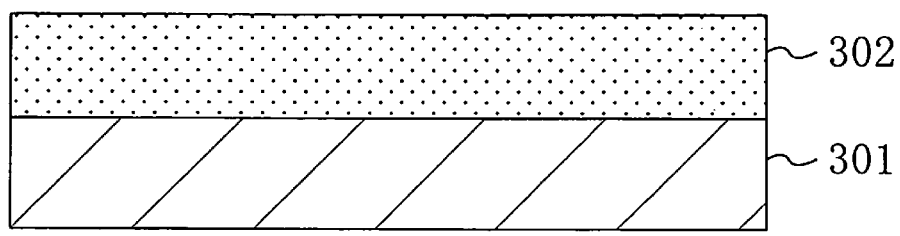
FIGS. 5A, 5B, 5C and 5D are cross-sectional views for showing procedures in a pattern formation method according to Embodiment 2 of the invention.

First, a positive chemically amplified resist material having the following composition is prepared:

Base polymer: poly(2-methyl-2-adamantyl acrylate-γ-butyrolactone methacrylate) . . . 2 g
Acid generator: triphenylsulfonium nonaflate . . . 0.06 g
Solvent: propylene glycol monomethyl ether acetate . . . 20 g Next, as shown in FIG. 5A, the chemically amplified resist material is applied on a substrate 301, so as to form a resist film 302 with a thickness of 0.4 μm.

Figure 5B:
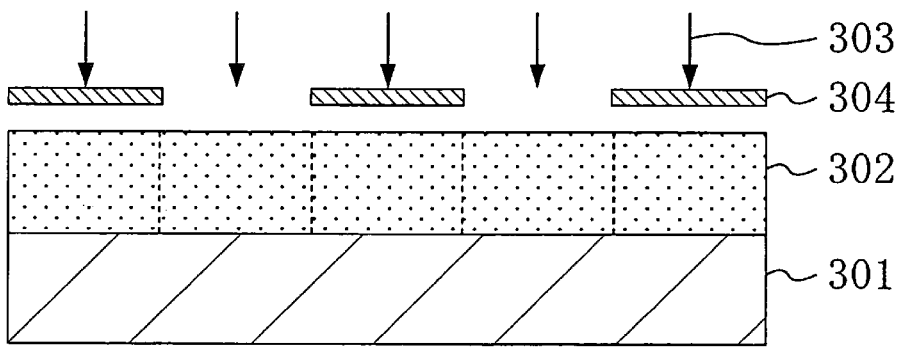

Then, as shown in FIG. 5B, the resist film 302 is subjected to pattern exposure by irradiating with exposing light 303 by using an ArF excimer laser stepper having numerical aperture (NA) of 0.60 through a mask 304 having a desired pattern.

Figure 5C:
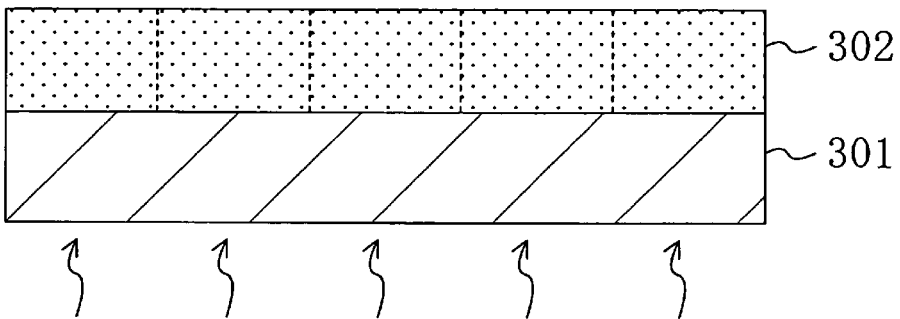

After the pattern exposure, as shown in FIG. 5C, the resist film 302 is subjected to post-exposure bake (PEB) by using, for example, a hot plate at a temperature of 105° C. for 90 seconds.

Figure 5D:
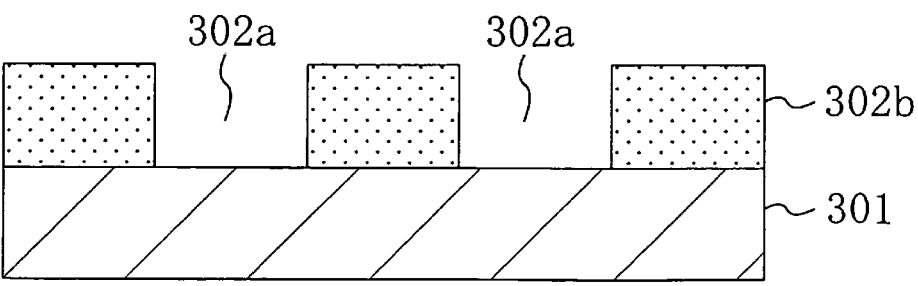

Next, the resist film 302 is developed with a 2.38 wt % tetramethylammonium hydroxide aqueous solution (alkaline developer) for 60 seconds. Thus, as shown in FIG. 5D, a first resist pattern 302b that is to be used for, for example, forming a contact hole, has an opening 302a with a diameter of 0.20 μm and is made of an unexposed portion of the resist film 302 is obtained.

Figure 6A:
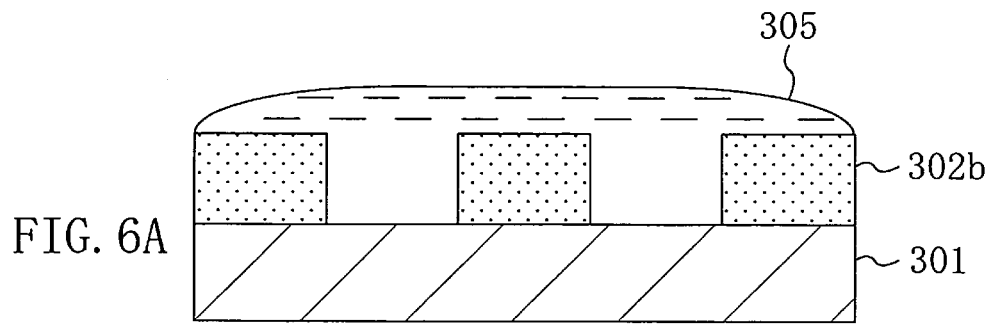
FIGS. 6A, 6B, 6C and 6D are cross-sectional views for showing other procedures in the pattern formation method according to Embodiment 2 of the invention.

Subsequently, as shown in FIG. 6A, the first resist pattern 302b having been formed on the substrate 301 is exposed to a 2.5 wt % tin dichloride ($SnCl_2$) solution 305, that is, a reducing agent for reducing carboxylic ester (γ-butyrolactone methacrylate) included in the base polymer of the resist material, for 30 seconds by the puddle method.

Figure 6B:
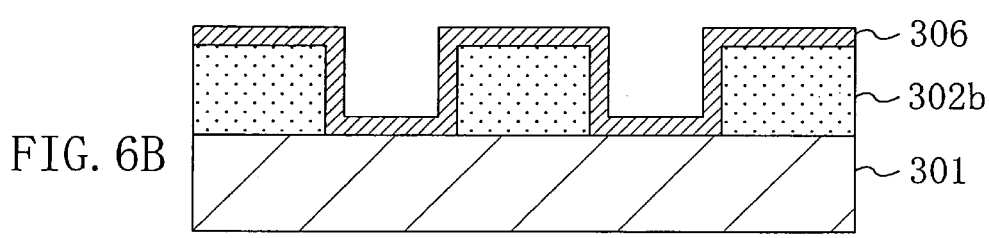

Next, as shown in FIG. 6B, a water-soluble film 306 including a crosslinking agent having a composition described below is applied over the substrate 301 including the first resist pattern 302b by the spin coating. At this point, the crosslinking agent included in the water-soluble film 306 is used for causing a crosslinking reaction between the base polymer of the water-soluble film 306 and the base polymer of the resist film 302.

Figure 6C:
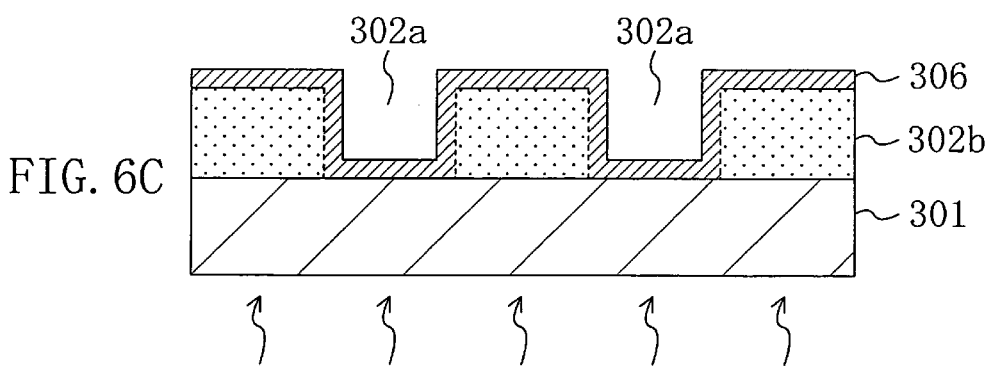

Base polymer: poly(vinyl alcohol) . . . 2 g
Crosslinking agent: 2,4,6-tris(methoxymethyl)amino-1,3,5-s-triazine . . . 0.2 g
Solvent: water . . . 30 g Then, as shown in FIG. 6C, the water-soluble film 306 is annealed at a temperature of 130° C. for 60 seconds, so as to cause a crosslinking reaction between a sidewall of the opening 302a of the first resist pattern 302b and a portion of the water-soluble film 306 in contact with the sidewall. At this point, the water-soluble film 306 reacts merely with the sidewall of the opening 302a of the first resist pattern 302b because the top face of the first resist pattern 302b corresponds to the unexposed portion that has not been irradiated with the exposing light 303 and hence no acid generated from the resist film 302 remains on the top face.

Figure 6D:
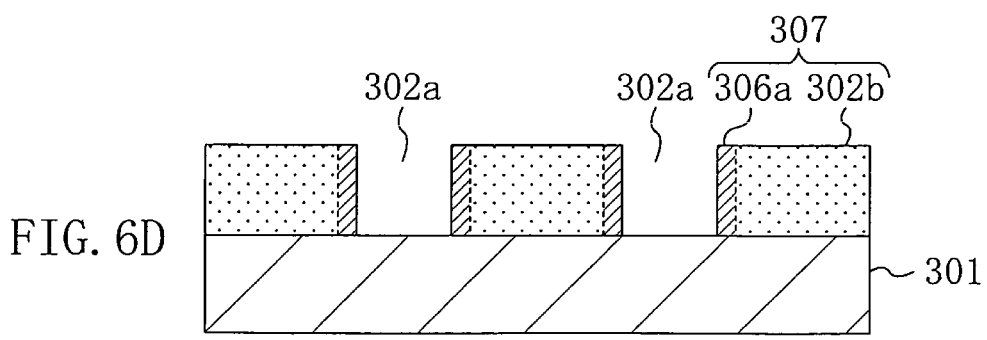

Next, a portion of the water-soluble film 306 not reacted with the first resist pattern 302b is removed by using pure water. In this manner, as shown in FIG. 6D, a second resist pattern 307 having the opening 302a with a shrunk opening diameter of 0.15 μm made of the first resist pattern 302b and a sidewall covering portion 306a of the water-soluble film 306 formed on the sidewall of the opening 302a of the first resist pattern 302b can be obtained in a good shape.

Thus, according to Embodiment 2, after forming the first resist pattern 302b, the first resist pattern 302b is exposed to the solution 305 including tin dichloride ($SnCl_2$), that is, the reducing agent for reducing the carboxylic ester (γ-butyrolactone methacrylate) included in the resist material, so as to reduce a carboxylic ester group included in the resist material into a hydroxyl group. Therefore, the crosslinking reaction between the hydroxyl group resulting from the reduction and the crosslinking agent included in the water-soluble film 306 is sufficiently proceeded, and hence, the second resist pattern 307 having the shrunk diameter of the opening 302a can be formed in a good shape.

Embodiment 3

A pattern formation method according to Embodiment 3 of the invention will now be described with reference to FIGS. 7A through 7D and 8A through 8C.

Figure 7A:
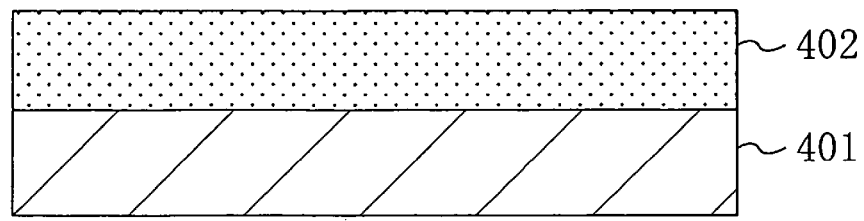
FIGS. 7A, 7B, 7C and 7D are cross-sectional views for showing procedures in a pattern formation method according to Embodiment 3 of the invention.

First, a positive chemically amplified resist material having the following composition is prepared:

Base polymer: poly(2-methyl-2-adamantyl acrylate-methacrylic acid) . . . 2 g
Acid generator: triphenylsulfonium nonaflate . . . 0.06 g
Solvent: propylene glycol monomethyl ether acetate . . . 20 g Next, as shown in FIG. 7A, the chemically amplified resist material is applied on a substrate 401, so as to form a resist film 402 with a thickness of 0.4 μm.

Figure 7B:
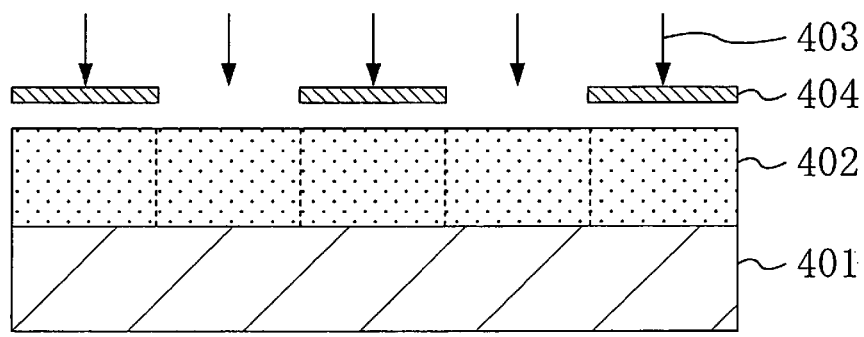

Then, as shown in FIG. 7B, the resist film 402 is subjected to pattern exposure by irradiating with exposing light 403 by using an ArF excimer laser stepper having numerical aperture (NA) of 0.60 through a mask 404 having a desired pattern.

Figure 7C:
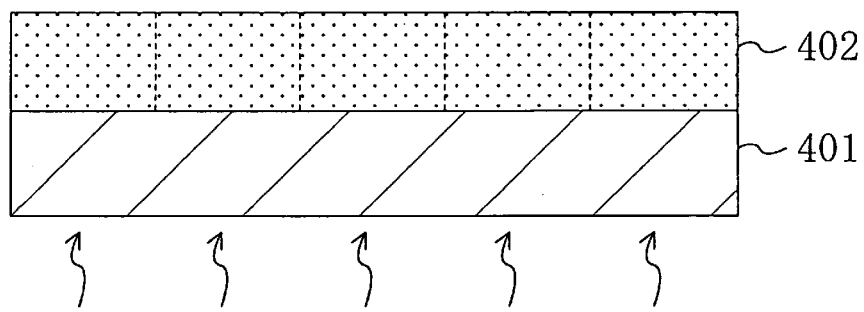

After the pattern exposure, as shown in FIG. 7C, the resist film 402 is subjected to post-exposure bake (PEB) by using, for example, a hot plate at a temperature of 105° C. for 90 seconds.

Figure 7D:
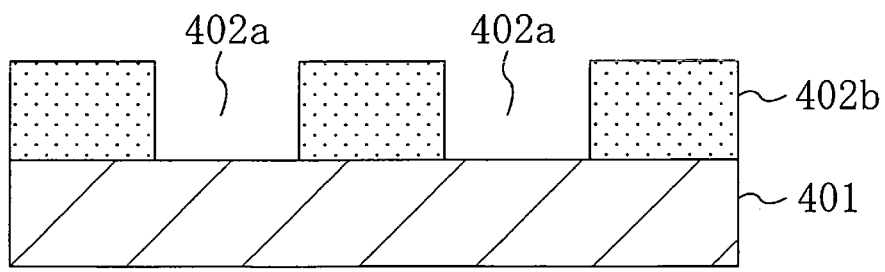

Next, the resist film 402 is developed with a 2.38 wt % tetramethylammonium hydroxide aqueous solution (alkaline developer) for 60 seconds. Thus, as shown in FIG. 7D, a first resist pattern 402b that is to be used for, for example, forming a contact hole, has an opening 402a with a diameter of 0.20 μm and is made of an unexposed portion of the resist film 402 is obtained.

Figure 8A:
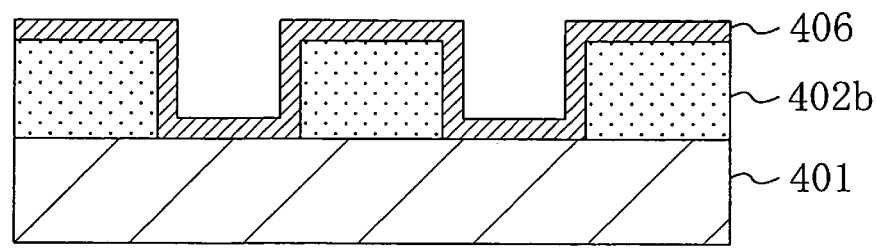
FIGS. 8A, 8B and 8C are cross-sectional views for showing other procedures in the pattern formation method according to Embodiment 3 of the invention.

Subsequently, as shown in FIG. 8A, a water-soluble film 406 including a crosslinking agent and a reducing agent having a composition described below is applied over the substrate 401 including the first resist pattern 402b by the spin coating. At this point, the crosslinking agent included in the water-soluble film 406 is used for causing a crosslinking reaction between the base polymer of the water-soluble film 406 and the base polymer of the resist film 402. Also, the reducing agent included in the water-soluble film 406 reduces a carboxylic group of the methacrylic acid included in the resist material into a hydroxyl group.

Figure 8B:
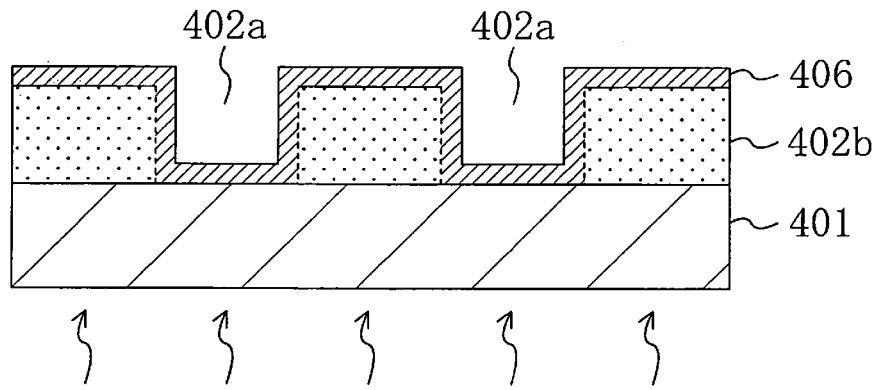

Base polymer: poly(vinyl alcohol) . . . 2 g
Crosslinking agent: 2,4,6-tris(methoxymethyl)amino-1,3,5-s-triazine . . . 0.2 g
Reducing agent: hydrogen disulfide ($H_2S$) . . . 0.04 g
Solvent: water . . . 30 g Then, as shown in FIG. 8B, the water-soluble film 406 including the reducing agent and the crosslinking agent is annealed at a temperature of 130° C. for 60 seconds, so as to cause a crosslinking reaction between a sidewall of the opening 402a of the first resist pattern 402b and a portion of the water-soluble film 406 in contact with the sidewall. At this point, the water-soluble film 406 reacts merely with the sidewall of the opening 402a of the first resist pattern 402b because the top face of the first resist pattern 402b corresponds to the unexposed portion that has not been irradiated with the exposing light 403 and hence no acid generated from the resist film 402 remains on the top face.

Figure 8C:
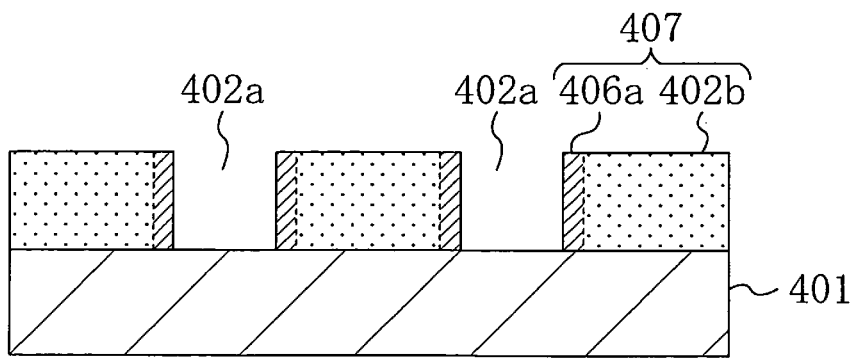

Next, a portion of the water-soluble film 406 not reacted with the first resist pattern 402b is removed by using pure water. In this manner, as shown in FIG. 8C, a second resist pattern 407 having the opening 402a with a shrunk opening diameter of 0.15 µm made of the first resist pattern 402b and a sidewall covering portion 406a of the water-soluble film 406 formed on the sidewall of the opening 402a of the first resist pattern 402b can be obtained in a good shape.

Thus, according to Embodiment 3, the water-soluble film 406 formed on the first resist pattern 402b after forming the first resist pattern 402b includes hydrogen disulfide ($H_2S$), that is, the reducing agent for reducing the carboxylic acid (methacrylic acid) included in the resist material, so as to reduce a carboxylic group included in the resist material into a hydroxyl group. Therefore, the crosslinking reaction between the hydroxyl group resulting from the reduction and the crosslinking agent included in the water-soluble film 406 is sufficiently proceeded, and hence, the second resist pattern 407 having the shrunk diameter of the opening 402a can be formed in a good shape.

It is noted that the reducing agent included in the water-soluble film 406 may be hydrogen iodide (HI) instead of the hydrogen disulfide.

Embodiment 4

A pattern formation method according to Embodiment 4 of the invention will now be described with reference to FIGS. 9A through 9D and 10A through 10C.

Figure 9A:
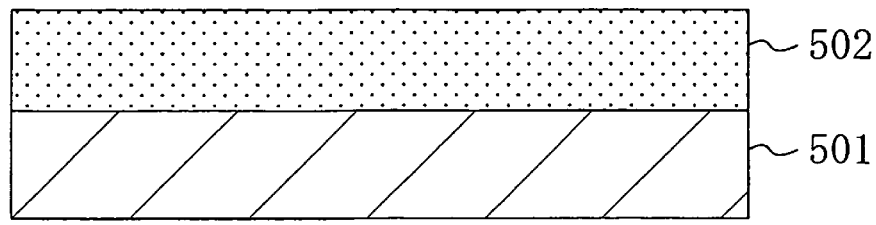
FIGS. 9A, 9B, 9C and 9D are cross-sectional views for showing procedures in a pattern formation method according to Embodiment 4 of the invention.

First, a positive chemically amplified resist material having the following composition is prepared:
Base polymer: poly(2-methyl-2-adamantyl acrylate-γ-butyrolactone methacrylate) . . . 2 g
Acid generator: triphenylsulfonium nonaflate . . . 0.06 g
Solvent: propylene glycol monomethyl ether acetate . . . 20 g Next, as shown in FIG. 9A, the chemically amplified resist material is applied on a substrate 501, so as to form a resist film 502 with a thickness of 0.4 µm.

Figure 9B:
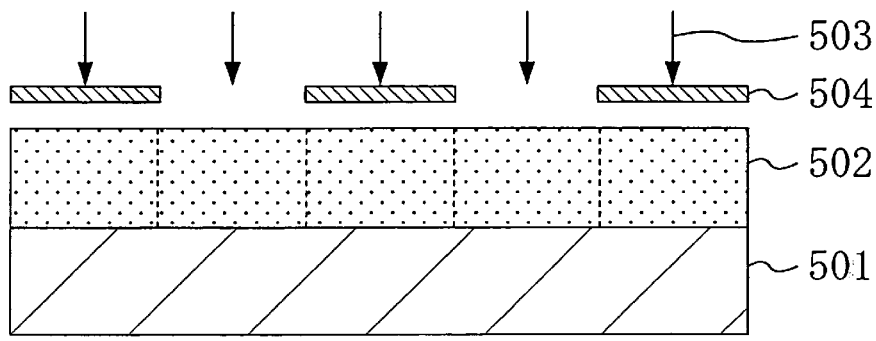

Then, as shown in FIG. 9B, the resist film 502 is subjected to pattern exposure by irradiating with exposing light 503 by using an ArF excimer laser stepper having numerical aperture (NA) of 0.60 through a mask 504 having a desired pattern.

Figure 9C:
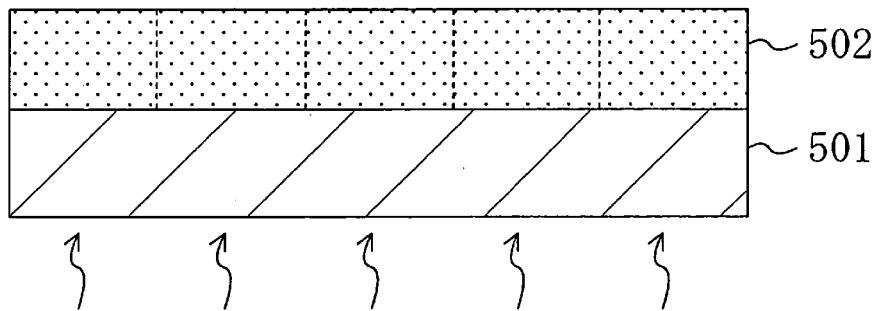

After the pattern exposure, as shown in FIG. 9C, the resist film 502 is subjected to post-exposure bake (PEB) by using, for example, a hot plate at a temperature of 105° C. for 90 seconds.

Figure 9D:
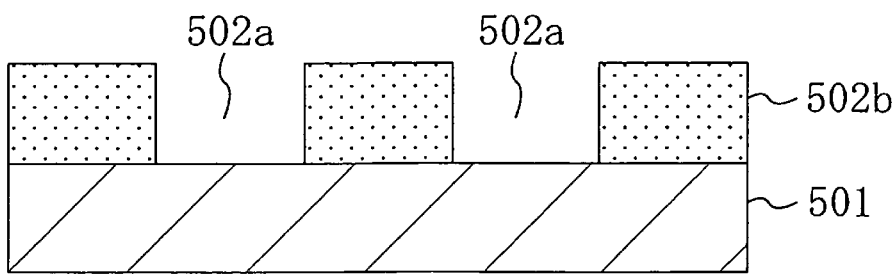

Next, the resist film 502 is developed with a 2.38 wt % tetramethylammonium hydroxide aqueous solution (alkaline developer) for 60 seconds. Thus, as shown in FIG. 9D, a first resist pattern 502b that is to be used for, for example, forming a contact hole, has an opening 502a with a diameter of 0.20 µm and is made of an unexposed portion of the resist film 502 is obtained.

Figure 10A:
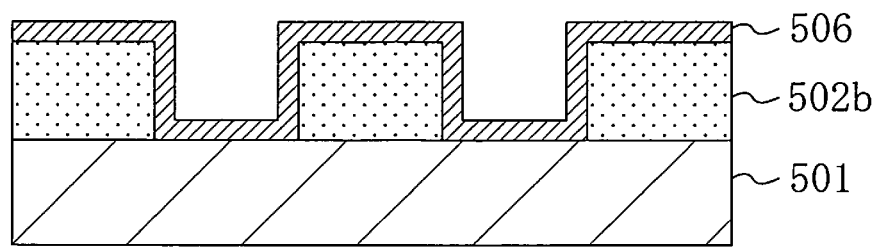
FIGS. 10A, 10B and 10C are cross-sectional views for showing other procedures in the pattern formation method according to Embodiment 4 of the invention.
Figure 10B:
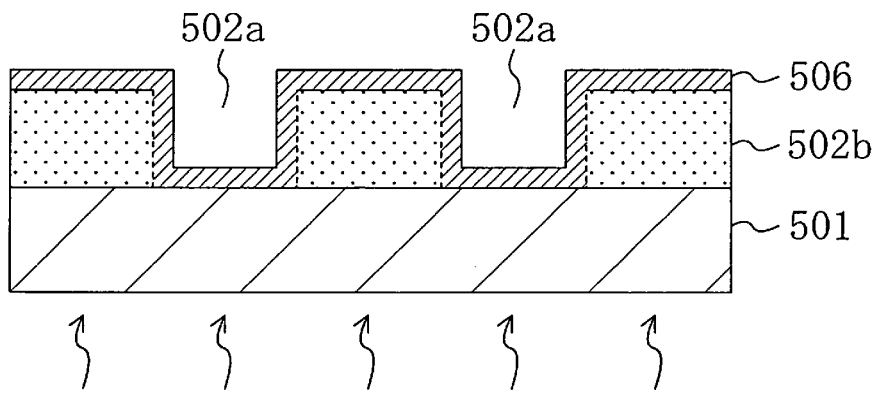

Subsequently, as shown in FIG. 10A, a water-soluble film 506 including a crosslinking agent and a reducing agent having a composition described below is applied over the substrate 501 including the first resist pattern 502b by the spin coating. At this point, the crosslinking agent included in the water-soluble film 506 is used for causing a crosslinking reaction between the base polymer of the water-soluble film 506 and the base polymer of the resist film 502. Also, the reducing agent included in the water-soluble film 506 reduces a carboxylic ester group of γ-butyrolactone methacrylate included in the resist material into a hydroxyl group.
Base polymer: poly(vinyl alcohol) . . . 2 g
Crosslinking agent: 2,4,6-tris(methoxymethyl)amino-1,3,5-s-triazine . . . 0.2 g
Reducing agent: iron dibromide ($FeBr_2$) . . . 0.03 g
Solvent: water . . . 30 g Then, as shown in FIG. 10B, the water-soluble film 506 including the reducing agent and the crosslinking agent is annealed at a temperature of 130° C. for 60 seconds, so as to cause a crosslinking reaction between a sidewall of the opening 502a of the first resist pattern 502b and a portion of the water-soluble film 506 in contact with the sidewall. At this point, the water-soluble film 506 reacts merely with the sidewall of the opening 502a of the first resist pattern 502b because the top face of the first resist pattern 502b corresponds to the unexposed portion that has not been irradiated with the exposing light 503 and hence no acid generated from the resist film 502 remains on the top face.

Figure 10C:
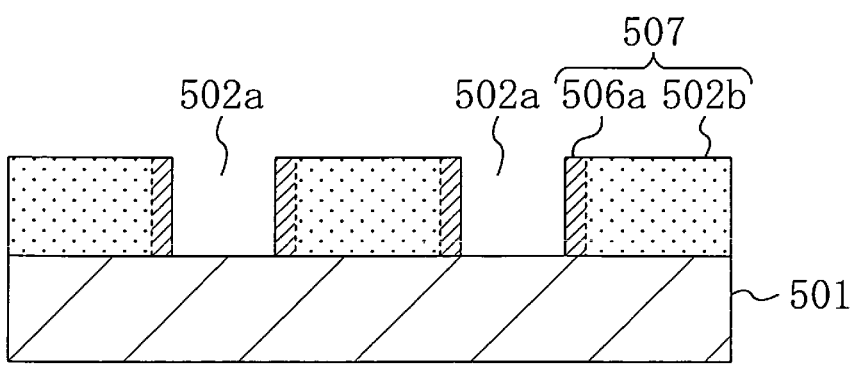

Next, a portion of the water-soluble film 506 not reacted with the first resist pattern 502b is removed by using pure water. In this manner, as shown in FIG. 10C, a second resist pattern 507 having the opening 502a with a shrunk opening diameter of 0.15 µm made of the first resist pattern 502b and a sidewall covering portion 506a of the water-soluble film 506 formed on the sidewall of the opening 502a of the first resist pattern 502b can be obtained in a good shape.

Thus, according to Embodiment 4, the water-soluble film 506 formed on the first resist pattern 502b after forming the first resist pattern 502b includes iron dibromide ($FeBr_2$), that is, the reducing agent for reducing the carboxylic ester (γ-butyrolactone methacrylate) included in the resist material, so as to reduce a carboxylic ester group included in the resist material into a hydroxyl group. Therefore, the crosslinking reaction between the hydroxyl group resulting from the reduction and the crosslinking agent included in the water-soluble film 506 is sufficiently proceeded, and hence, the second resist pattern 507 having the shrunk diameter of the opening 502a can be formed in a good shape.

Embodiment 5

A pattern formation method according to Embodiment 5 of the invention will now be described with reference to FIGS. 11A through 11D and 12A through 12D.

Figure 11A:
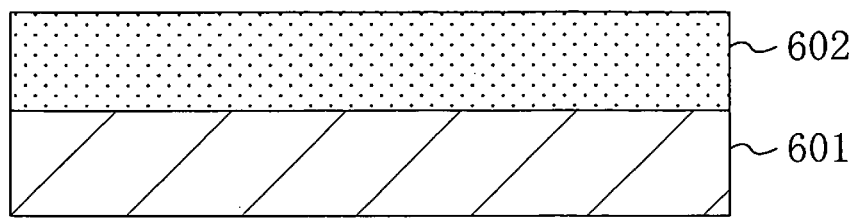
FIGS. 11A, 11B, 11C and 11D are cross-sectional views for showing procedures in a pattern formation method according to Embodiment 5 of the invention.

First, a positive chemically amplified resist material having the following composition is prepared:
Base polymer: poly(2-methyl-2-adamantyl acrylate-methacrylic acid) . . . 2 g
Acid generator: triphenylsulfonium nonaflate . . . 0.06 g
Solvent: propylene glycol monomethyl ether acetate . . . 20 g Next, as shown in FIG. 11A, the chemically amplified resist material is applied on a substrate 601, so as to form a resist film 602 with a thickness of 0.4 µm.

Figure 11B:
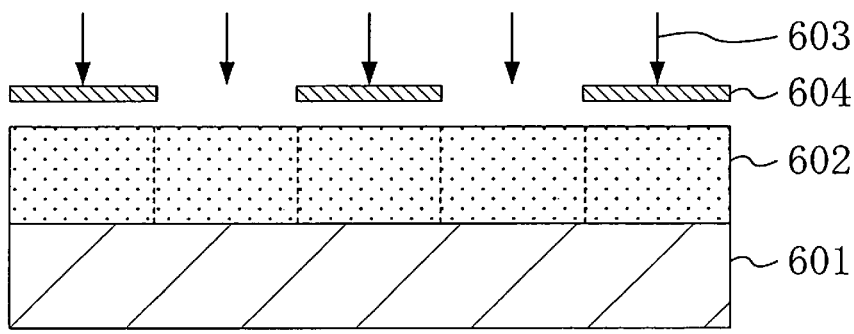

Then, as shown in FIG. 11B, the resist film 602 is subjected to pattern exposure by irradiating with exposing light 603 by using an ArF excimer laser stepper having numerical aperture (NA) of 0.60 through a mask 604 having a desired pattern.

Figure 11C:
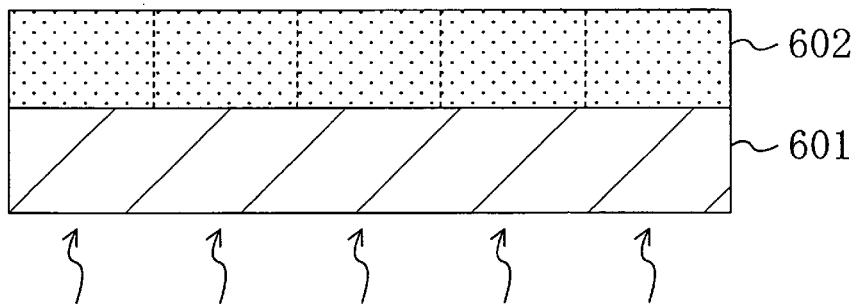

After the pattern exposure, as shown in FIG. 11C, the resist film 602 is subjected to post-exposure bake (PEB) by using, for example, a hot plate at a temperature of 105° C. for 90 seconds.

Figure 11D:
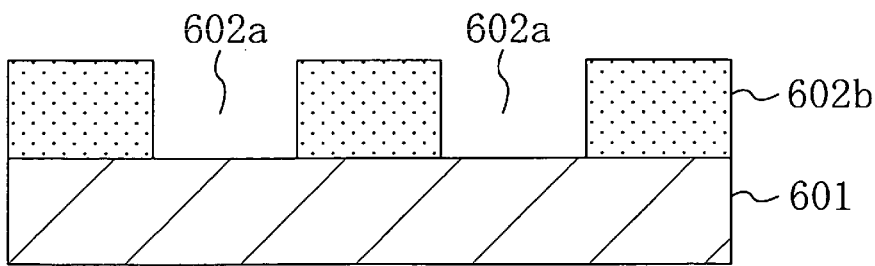

Next, the resist film 602 is developed with a 2.38 wt % tetramethylammonium hydroxide aqueous solution (alkaline developer) for 60 seconds. Thus, as shown in FIG. 11D, a first resist pattern 602b that is to be used for, for example, forming a contact hole, has an opening 602a with a diameter of 0.20 μm and is made of an unexposed portion of the resist film 602 is obtained.

Figure 12A:
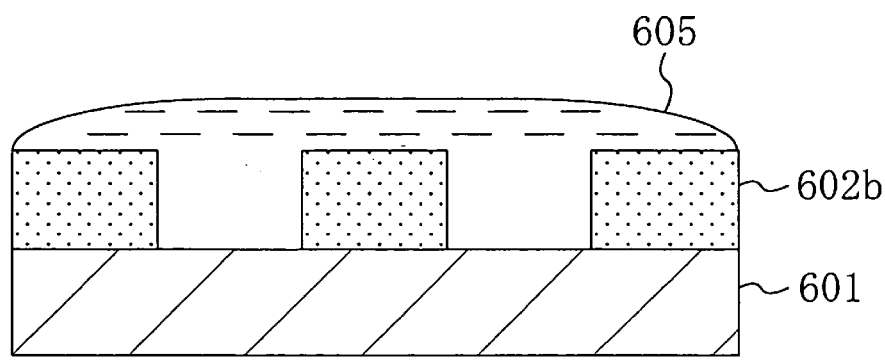
FIGS. 12A, 12B, 12C and 12D are cross-sectional views for showing other procedures in the pattern formation method according to Embodiment 5 of the invention.

Subsequently, as shown in FIG. 12A, the first resist pattern 602b having been formed on the substrate 601 is exposed to a 1.5 wt % iron dichloride ($FeCl_2$) solution 605, that is, a reducing agent for reducing carboxylic acid (methacrylic acid) included in the base polymer of the resist material, for 60 seconds by the puddle method.

Figure 12B:
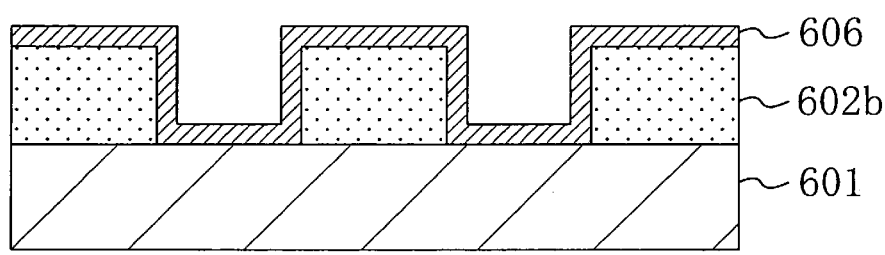

Next, as shown in FIG. 12B, a water-soluble film 606 including a crosslinking agent and a reducing agent having a composition described below is applied over the substrate 601 including the first resist pattern 602b by the spin coating. At this point, the crosslinking agent included in the water-soluble film 606 is used for causing a crosslinking reaction between the base polymer of the water-soluble film 606 and the base polymer of reduces a carboxylic group of the methacrylic acid included in the resist material into a hydroxyl group.

Figure 12C:
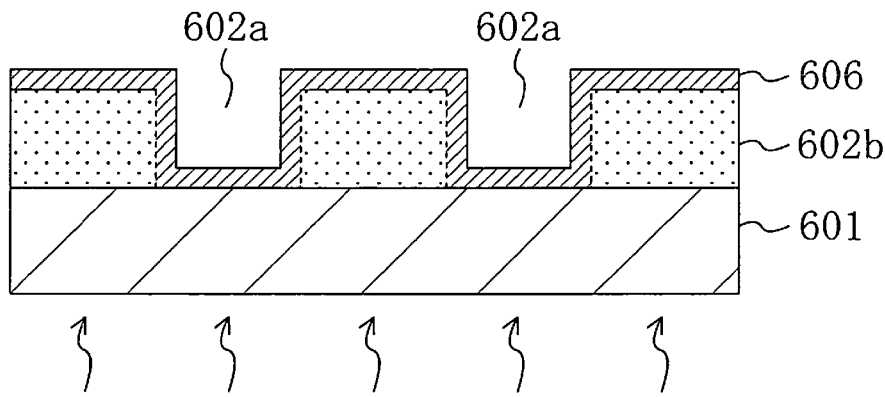

Base polymer: poly(vinyl alcohol) . . . 2 g
    Crosslinking agent: 2,4,6-tris(methoxymethyl)amino-1,3,5-s-triazine . . . 0.2 g
    Reducing agent: hydrogen disulfide ($H_2S$) . . . 0.04 g
    Solvent: water . . . 30 g Then, as shown in FIG. 12C, the water-soluble film 606 including the reducing agent and the crosslinking agent is annealed at a temperature of 130° C. for 60 seconds, so as to cause a crosslinking reaction between a sidewall of the opening 602a of the first resist pattern 602b and a portion of the water-soluble film 606 in contact with the sidewall. At this point, the water-soluble film 606 reacts merely with the sidewall of the opening 602a of the first resist pattern 602b because the top face of the first resist pattern 602b corresponds to the unexposed portion that has not been irradiated with the exposing light 603 and hence no acid generated from the resist film 602 remains on the top face.

Figure 12D:
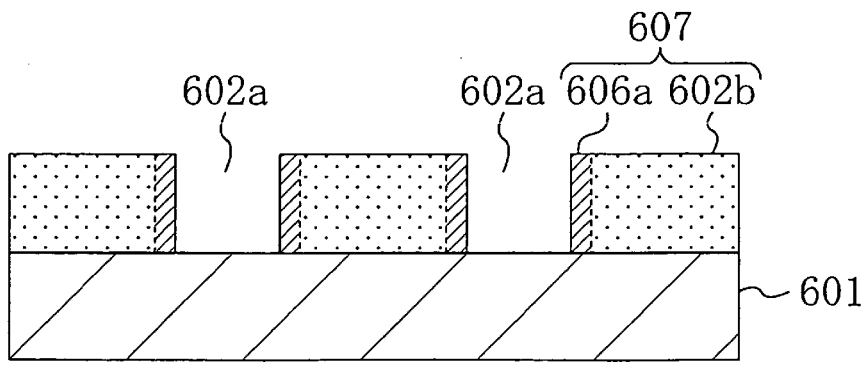

Next, a portion of the water-soluble film 606 not reacted with the first resist pattern 602b is removed by using pure water. In this manner, as shown in FIG. 12D, a second resist pattern 607 having the opening 602a with a shrunk opening diameter of 0.15 μm made of the first resist pattern 602b and a sidewall covering portion 606a of the water-soluble film 606 formed on the sidewall of the opening 602a of the first resist pattern 602b can be obtained in a good shape.

Thus, according to Embodiment 5, after forming the first resist pattern 602b, the first resist pattern 602b is exposed to the solution 605 including iron dichloride ($FeCl_2$), that is, the reducing agent for reducing the carboxylic acid (methacrylic acid) included in the resist material, and thereafter, the water-soluble film 606 formed on the first resist pattern 602a also includes disulfide ($H_2S$), that is, the reducing agent for reducing the carboxylic acid included in the resist material. Thus, a carboxylic group included in the resist material can be more definitely reduced into a hydroxyl group. Therefore, the crosslinking reaction between the first resist pattern 602b and the crosslinking agent included in the water-soluble film 606 is sufficiently proceeded, and hence, the second resist pattern 607 having the shrunk diameter of the opening 602a can be formed in a better shape.

It is noted that the reducing agent included in the water-soluble film 606 may be hydrogen iodide (HI) instead of the hydrogen disulfide.

Embodiment 6

A pattern formation method according to Embodiment 6 of the invention will now be described with reference to FIGS. 13A through 13D and 14A through 14D.

Figure 13A:
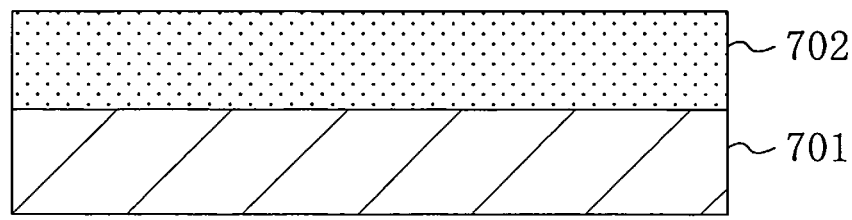
FIGS. 13A, 13B, 13C and 13D are cross-sectional views for showing procedures in a pattern formation method according to Embodiment 6 of the invention.

First, a positive chemically amplified resist material having the following composition is prepared:
    Base polymer: poly(2-methyl-2-adamantyl acrylate-γ-butyrolactone methacrylate) . . . 2 g
    Acid generator: triphenylsulfonium nonaflate . . . 0.06 g
    Solvent: propylene glycol monomethyl ether acetate . . . 20 g Next, as shown in FIG. 13A, the chemically amplified resist material is applied on a substrate 701, so as to form a resist film 702 with a thickness of 0.4 μm.

Figure 13B:
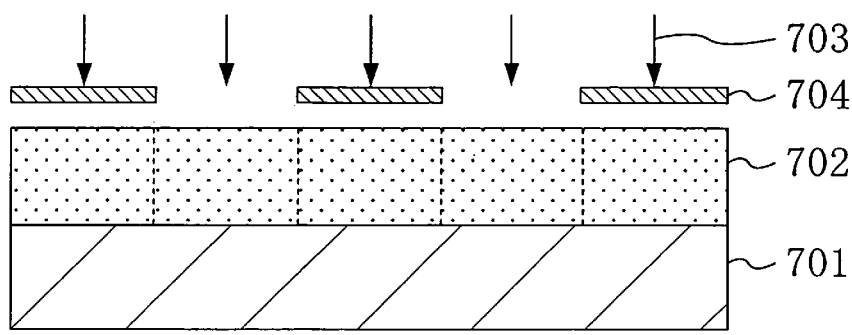

Then, as shown in FIG. 13B, the resist film 702 is subjected to pattern exposure by irradiating with exposing light 703 by using an ArF excimer laser stepper having numerical aperture (NA) of 0.60 through a mask 704 having a desired pattern.

Figure 13C:
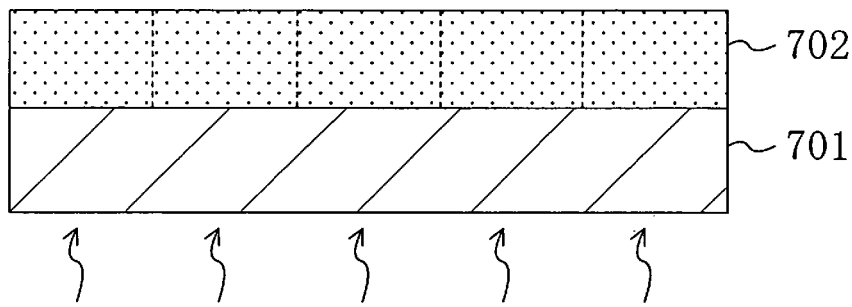

After the pattern exposure, as shown in FIG. 13C, the resist film 702 is subjected to post-exposure bake (PEB) by using, for example, a hot plate at a temperature of 105° C. for 90 seconds.

Figure 13D:
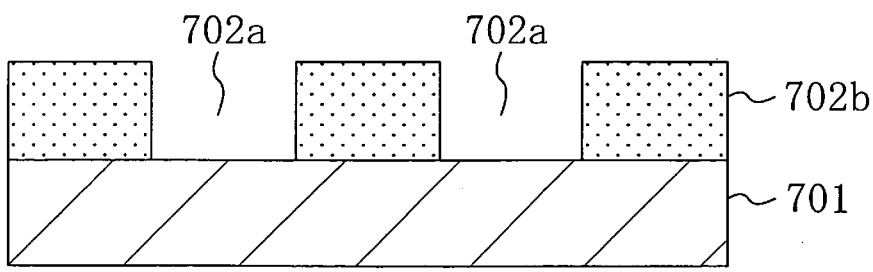

Next, the resist film 702 is developed with a 2.38 wt % tetramethylammonium hydroxide aqueous solution (alkaline developer) for 60 seconds. Thus, as shown in FIG. 13D, a first resist pattern 702b that is to be used for, for example, forming a contact hole, has an opening 702a with a diameter of 0.20 μm and is made of an unexposed portion of the resist film 702 is obtained.

Figure 14A:
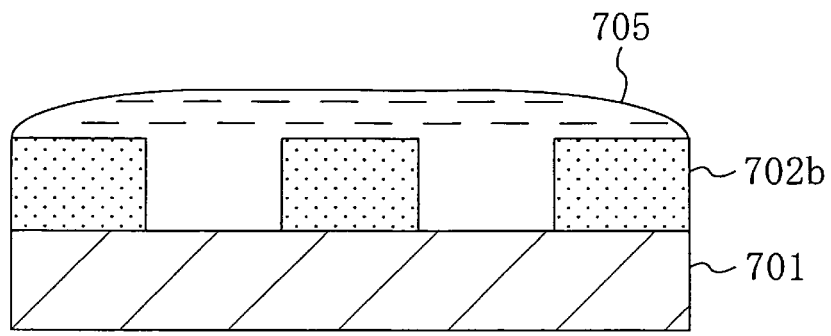
FIGS. 14A, 14B, 14C and 14D are cross-sectional views for showing other procedures in the pattern formation method according to Embodiment 6 of the invention.

Subsequently, as shown in FIG. 14A, the first resist pattern 702b having been formed on the substrate 701 is exposed to a 2.5 wt % tin dichloride ($SnCl_2$) solution 705, that is, a reducing agent for reducing carboxylic ester (γ-butyrolactone methacrylate) included in the base polymer of the resist material, for 30 seconds by the puddle method.

Figure 14B:
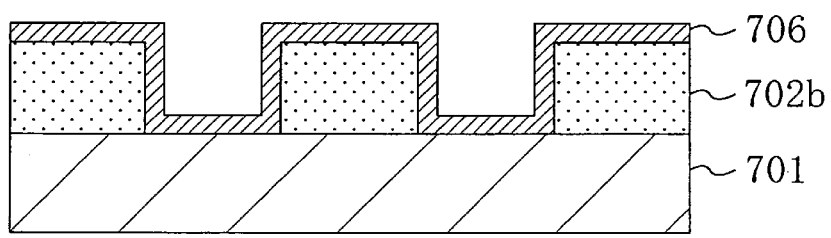

Next, as shown in FIG. 14B, a water-soluble film 706 including a crosslinking agent and a reducing agent having a composition described below is applied over the substrate 701 including the first resist pattern 702b by the spin coating. At this point, the crosslinking agent included in the water-soluble film 706 is used for causing a crosslinking reaction between the base polymer of the water-soluble film 706 and the base polymer of the resist film 702. Also, the reducing agent included in the water-soluble film 706 reduces a carboxylic ester group of the y-butyrolactone methacrylate included in the resist material into a hydroxyl group.

Figure 14C:
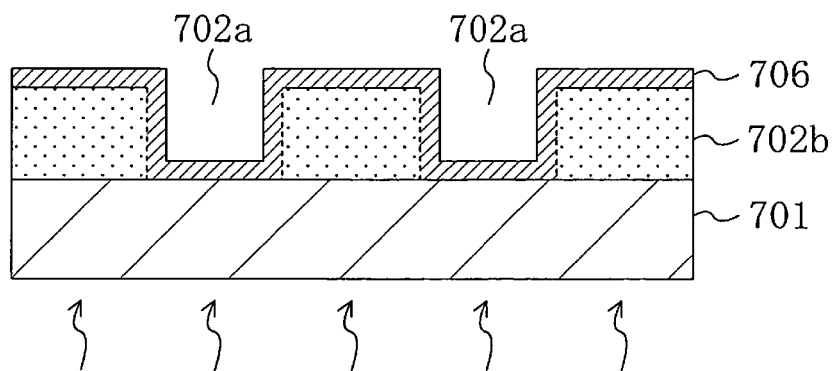

Base polymer: poly(vinyl alcohol) . . . 2 g
    Crosslinking agent: 2,4,6-tris(methoxymethyl)amino-1,3,5-s-triazine . . . 0.2 g
    Reducing agent: iron dibromide ($FeBr_2$) . . . 0.03 g
    Solvent: water . . . 30 g Then, as shown in FIG. 14C, the water-soluble film 706 including the reducing agent and the crosslinking agent is annealed at a temperature of 130° C. for 60 seconds, so as to cause a crosslinking reaction between a sidewall of the opening 702a of the first resist pattern 702b and a portion of the water-soluble film 706 in contact with the sidewall. At this point, the water-soluble film 706 reacts merely with the sidewall of the opening 702a of the first resist pattern 702b because the top face of the first resist pattern 702b corresponds to the unexposed portion that has not been irradiated with the exposing light 703 and hence no acid generated from the resist film 702 remains on the top face.

Figure 14D:
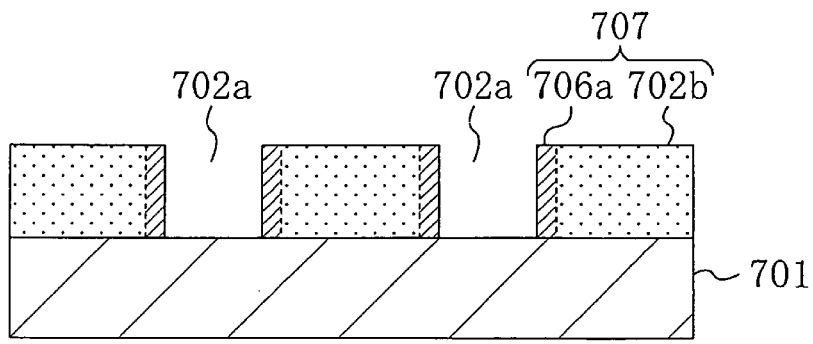
Figure 15A:
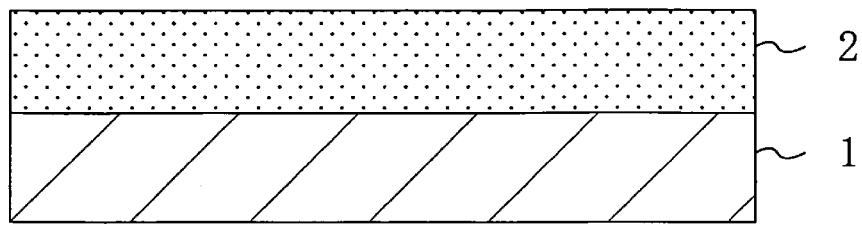
FIGS. 15A, 15B, 15C and 15D are cross-sectional views for showing procedures in a conventional pattern formation method.
Figure 15B:
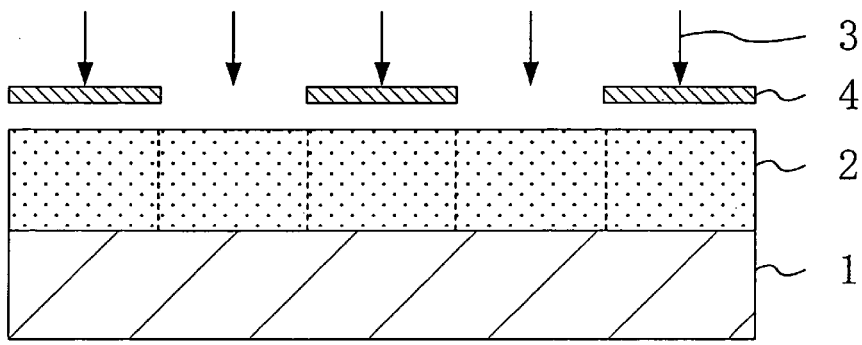
Figure 15C:
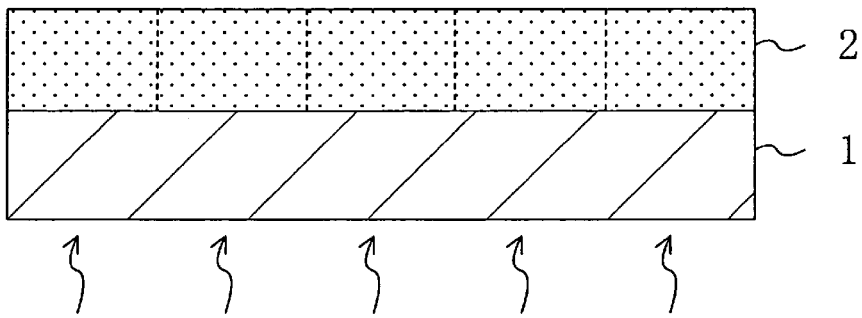
Figure 15D:
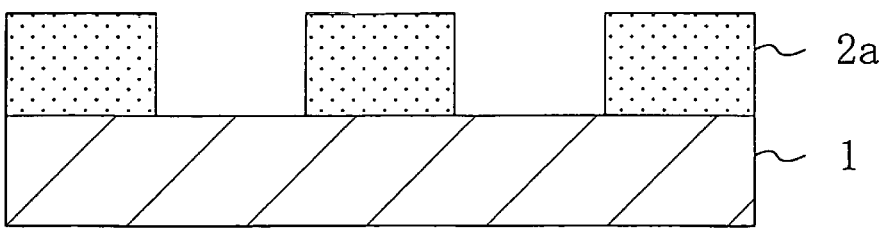
Figure 16A:
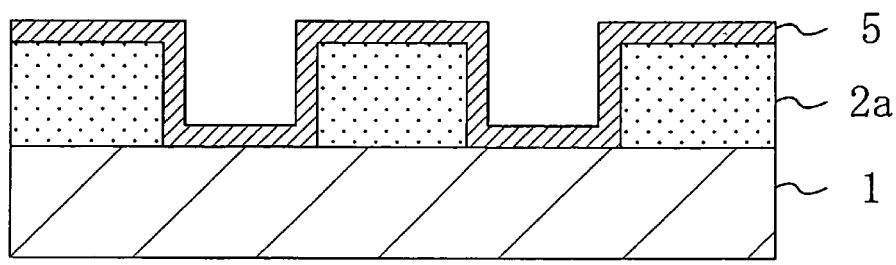
FIGS. 16A, 16B and 16C are cross-sectional views for showing other procedures in the conventional pattern formation method.
Figure 16B:
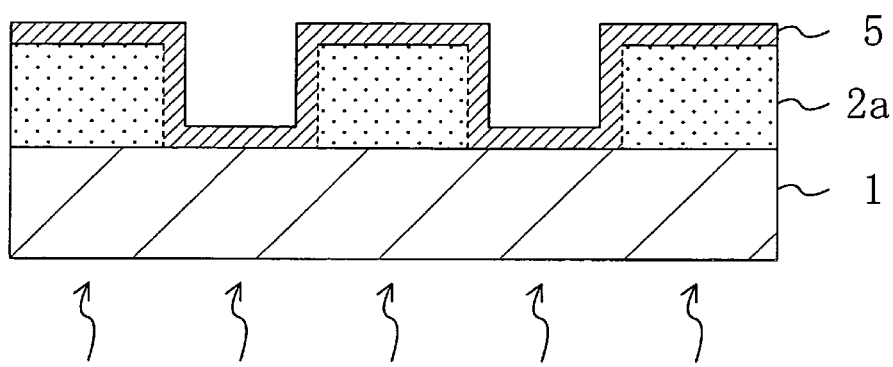
Figure 16C:
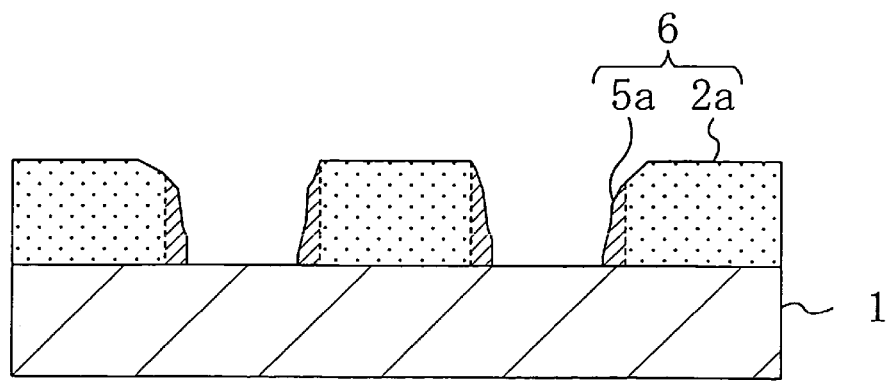

Next, a portion of the water-soluble film 706 not reacted with the first resist pattern 702b is removed by using pure water. In this manner, as shown in FIG. 14D, a second resist pattern 707 having the opening 702a with a shrunk opening diameter of 0.15 µm made of the first resist pattern 702b and a sidewall covering portion 706a of the water-soluble film 706 formed on the sidewall of the opening 702a of the first resist pattern 702b can be obtained in a good shape.

Thus, according to Embodiment 6, after forming the first resist pattern 702b, the first resist pattern 702b is exposed to the solution 705 including tin dichloride ($SnCl_2$), that is, the reducing agent for reducing the carboxylic ester (γ-butyrolactone methacrylate) included in the resist material, and thereafter, the water-soluble film 706 formed on the first resist pattern 702b also includes iron dibromide ($FeBr_2$), that is, the reducing agent for reducing the carboxylic ester included in the resist material. Thus, a carboxylic ester group included in the resist material can be more definitely reduced into a hydroxyl group. Therefore, the crosslinking reaction between the first resist pattern 702b and the crosslinking agent included in the water-soluble film 706 is sufficiently proceeded, and hence, the second resist pattern 707 having the shrunk diameter of the opening 702a can be formed in a better shape.

In each of Embodiment 1, the modification of Embodiment 1 and Embodiments 2, 5 and 6, the processing for bringing the patterned first resist pattern into contact with the reducing agent is performed by the puddle method, which does not limit the invention. Instead of the puddle method, a dip method in which the whole substrate is dipped in the solution or a spray method in which the solution is sprayed on the first resist pattern may be employed.

The crosslinking agent included in the water-soluble film is not limited to 2,4,6-tris(methoxymethyl)amino-1,3,5-s-triazine but may be 1,3,5-N-(trihydroxymethyl)melamine, 2,4,6-tris(ethoxymethyl)amino-1,3,5-s-triazine, tetramethoxymethyl glycolurea, tetramethoxymethylurea, 1,3,5-tris(methoxymethoxy)benzene or 1,3,5-tris(isopropoxymethoxy)benzene instead.

Furthermore, the base polymer of the water-soluble film is not limited to poly(vinyl alcohol) but may be poly(vinylpyrrolidone), poly(acrylic acid), polystyrene sulfonic acid or pullulan.

The resist material used for forming the first resist pattern is not limited to a positive resist material but may be a negative resist material.

The second resist pattern formed by shrinking the opening diameter of the first resist pattern is not limited to one used for forming a contact hole but may be applied to a line and space pattern of interconnects or the like for shrinking the width of a space portion.

Moreover, the exposing light is not limited to ArF excimer layer but KrF excimer layer, $F_2$ laser, $Kr_2$ laser, ArKr laser or $Ar_2$ layer may be used.

As described so far, the pattern formation method of this invention has an effect to attain a good shape of a second resist pattern formed by shrinking the opening diameter or the space width of a first resist pattern, and hence, a target film to be etched by using the second resist pattern can be patterned into a good shape. Therefore, the present invention is useful as a pattern formation method for use in fabrication process or the like for semiconductor devices.

What is claimed is:

1. A pattern formation method comprising the steps of:
    forming a resist film on a substrate, said resist including a carboxylic acid derivative;
    performing pattern exposure by selectively irradiating with exposing light;
    forming a first resist pattern by developing said resist film after the pattern exposure;
    forming, on said first resist pattern, a water-soluble film including a reducing agent for reducing said carboxylic acid derivative and a crosslinking agent which reacts with said first resist pattern;
    annealing said water-soluble film;
    removing a first portion of said water-soluble film; and
    forming a second resist pattern having said first resist pattern and a second portion of said water-soluble film,
    wherein said first portion of said water-soluble film is a portion which does not react with said first pattern and said second portion of said water-soluble film is a portion which reacts with said first resist pattern.

2. The pattern formation method of claim 1, further comprising, between the step of forming a first resist pattern and the step of forming a water-soluble film, a step of exposing said first resist pattern to a solution including a reducing agent for reducing said carboxylic acid derivative.

3. The pattern formation method of claim 1,
    wherein said carboxylic acid derivative is a carboxylic group or a carboxylic ester group.

4. The pattern formation method of claim 1,
    wherein said reducing agent is hydrogen iodide (HI) or hydrogen disulfide ($H_2S$).

5. The pattern formation method of claim 1,
    wherein said reducing agent is an oxide of an element having a valence lower than a standard valence.

6. The pattern formation method of claim 5,
    wherein said oxide is carbon monoxide (CO) or sulfur dioxide ($SO_2$).

7. The pattern formation method of claim 1,
    wherein said water-soluble film includes poly(vinyl alcohol), poly(vinylpyrrolidone), poly(acrylic acid), polystyrene sulfonic acid or pullulan.

8. The pattern formation method of claim 1,
    wherein said exposing light is ArF excimer laser, KrF excimer laser, $F_2$ laser, $Kr_2$ laser, ArKr laser or $Ar_2$ laser or has a wavelength of 1 nm through 30 nm.

9. A pattern formation method comprising the steps of:
    forming on a substrate a resist film made of a chemically amplified resist including a carboxylic acid derivative and a photoacid generator;
    performing pattern exposure by selectively irradiating said resist film with exposure light;
    forming a first resist pattern by developing said resist film after the pattern exposure;
    forming on said first resist pattern a water-soluble film including a reducing agent and a crosslinking agent;
    annealing said water-soluble film;
    removing a first portion of said water-soluble film;
    forming a second resist pattern having said first resist pattern and a second portion of said water-soluble film;
    wherein the step of forming said water-soluble film is a step of applying a water-soluble material including said reducing agent and said crosslinking agent onto said substrate; and
    said first portion of said water-soluble film is a portion which does not react with said first resist pattern, and said second portion of said water-soluble film is a portion which reacts with said first resist pattern.

* * * * *